(12) United States Patent
Huang et al.

(10) Patent No.: US 9,653,295 B1
(45) Date of Patent: May 16, 2017

(54) METHOD OF MANUFACTURING A STATIC RANDOM ACCESS MEMORY

(71) Applicant: TAIWAN SEMICONDUCTOR MANUFACTURING CO., LTD., Hsinchu (TW)

(72) Inventors: Shih-Han Huang, Hsinchu (TW); Chih-Hung Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/990,604

(22) Filed: Jan. 7, 2016

(51) Int. Cl.
| | |
|---|---|
| *H01L 21/00* | (2006.01) |
| *H01L 21/033* | (2006.01) |
| *H01L 21/8238* | (2006.01) |
| *H01L 27/092* | (2006.01) |
| *H01L 27/11* | (2006.01) |

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/823821* (2013.01); *H01L 27/0924* (2013.01); *H01L 27/1104* (2013.01); *H01L 27/1116* (2013.01)

(58) Field of Classification Search
CPC ............... H01L 21/823418–21/823431; H01L 21/823814–21/823821; H01L 21/845; H01L 27/0886–27/0924; H01L 27/10826; H01L 27/10879; H01L 27/1211; H01L 29/41791; H01L 29/66772; H01L 29/66795; H01L 29/7831; H01L 29/785; H01L 2924/13067
See application file for complete search history.

(56) References Cited

U.S. PATENT DOCUMENTS

| | | | |
|---|---|---|---|
| 2010/0155906 A1* | 6/2010 | Lee | H01L 21/0337 257/623 |
| 2011/0159659 A1* | 6/2011 | Chiu | H01L 21/76237 438/359 |
| 2015/0318181 A1* | 11/2015 | Cantone | H01L 21/823431 438/702 |

* cited by examiner

*Primary Examiner* — Cuong B Nguyen
(74) *Attorney, Agent, or Firm* — McDermott Will & Emery LLP

(57) ABSTRACT

In a method of manufacturing an SRAM, first dummy patterns are formed over a substrate, on which a first to a third mask layer are formed. Intermediate dummy patterns are formed on sidewalls of the first dummy patterns. The first dummy patterns are removed, thereby leaving the intermediate dummy patterns. The third mask layer is patterned by using the intermediate dummy patterns, by which the second mask layer is patterned, thereby forming second dummy patterns. Sidewall spacer layers are formed on sidewalls of the second dummy patterns. The second dummy patterns are removed, thereby leaving the sidewall spacer layers as hard mask patterns over the substrate, by which the first mask layer is patterned. The substrate is patterned by using the patterned first mask layer. Each of the plurality of SRAM cells is defined by a cell boundary, within which only two first dummy patterns are included.

20 Claims, 20 Drawing Sheets

US 9,653,295 B1

METHOD OF MANUFACTURING A STATIC RANDOM ACCESS MEMORY

TECHNICAL FIELD

The disclosure relates to a semiconductor device, and more particularly to a semiconductor SRAM (Static Random Access Memory) device having field effect transistor (FET) devices, and to its manufacturing process.

BACKGROUND

As the semiconductor industry has progressed into nanometer technology process nodes in pursuit of higher device density, higher performance, lower power consumption and lower costs, challenges from both fabrication and design issues have resulted in the development of three-dimensional designs, such as a fin field effect transistor (Fin FET). In a Fin FET device, it is possible to utilize additional sidewalls and to suppress a short channel effect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-12C show exemplary sequential manufacturing processes of an SRAM device according to one embodiment of the present disclosure.

FIGS. 13A-16C show exemplary sequential processes for manufacturing fin structures for an SRAM device according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Further, the layout structures shown in the present disclosure are design layouts and do not necessarily show exact physical structures fabricated as a semiconductor device.

Figure 1A:
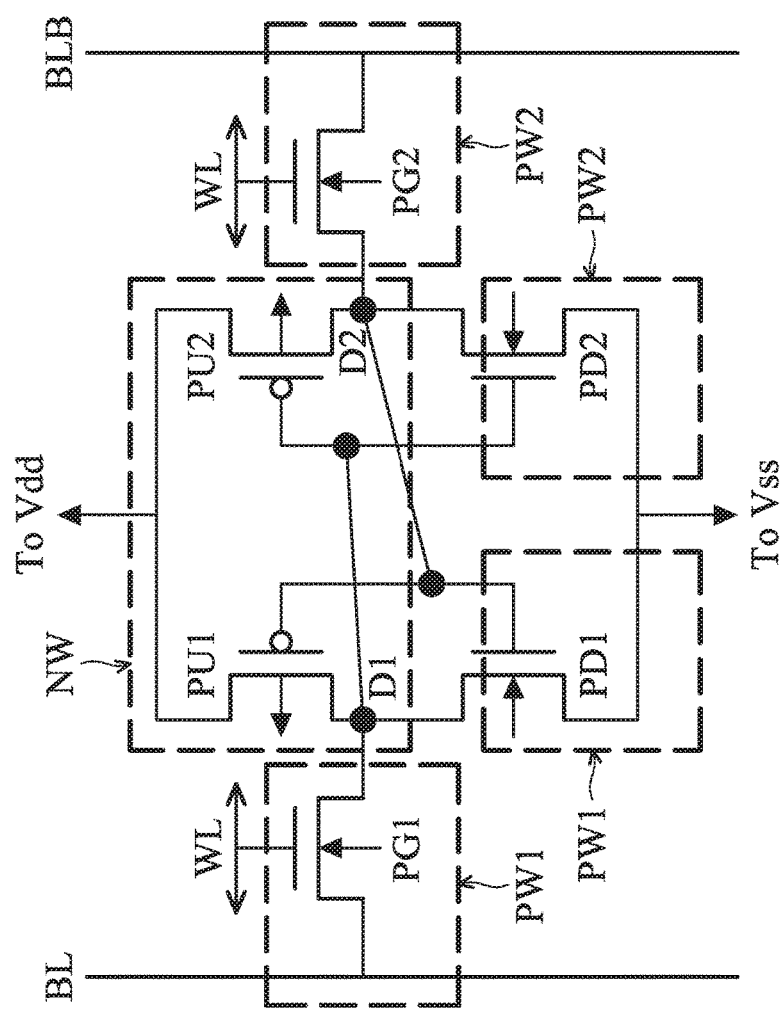
FIG. 1A is an exemplary circuit diagram of an SRAM unit cell.

FIG. 1A is an exemplary circuit diagram of an SRAM unit cell. An SRAM unit cell includes two cross-coupled inverters having a data storage node and a complementary data storage node. The output of the first inverter is coupled to the input of the second inverter, and the output of the second inverter is coupled to the input of the first inverter. The SRAM further includes a first pass-gate FET device PG1 coupled to the output of the first inverter and the input of the second inverter and a second pass-gate FET device PG2 coupled to the output of the second inverter and the input of the first inverter. Gates of the first and second pass-gate FET devices are coupled to a word line WL, a source/drain of the first pass-gate FET device PG1 is coupled to a first bit line BL, and a source/drain of the second pass-gate FET device PG2 is coupled to a second bit line BLB, which is the complement of the first bit line BL. In the present disclosure, a source and a drain of an FET device may be interchangeably used.

The first inverter includes a first first-conductive-type FET device PU1 and a first second-conductive-type FET device PD1. The second inverter includes a second first-conductive-type FET device PU2 and a second second-conductive-type FET device PD2. The first pass-gate device PG1 and the second pass-gate device PG2 are second-conductive type devices. In the first embodiment, the first conductive type is a P-type and the second conductive type is an N-type. Of course, it is possible in another embodiment that the first conductive type is an N-type and the second conductive type is a P-type, and in such a case the remaining elements in the SRAM are appropriately modified according to the common knowledge in the art.

The SRAM further includes a first P-type well PW1, a second P-type well PW2 and an N-type well NW. As shown in FIG. 1A, the first pass-gate device PG1 (N-type) and the first N-type FET device PD1 are disposed within the first P-type well PW1, the second pass-gate FET device PG2 (N-type) and the second N-type FET device PD2 are disposed within the second P-type well PW2, and the first P-type FET device PU1 and the second P-type FET device PU2 are disposed within the N-type well NW.

Figure 1B:
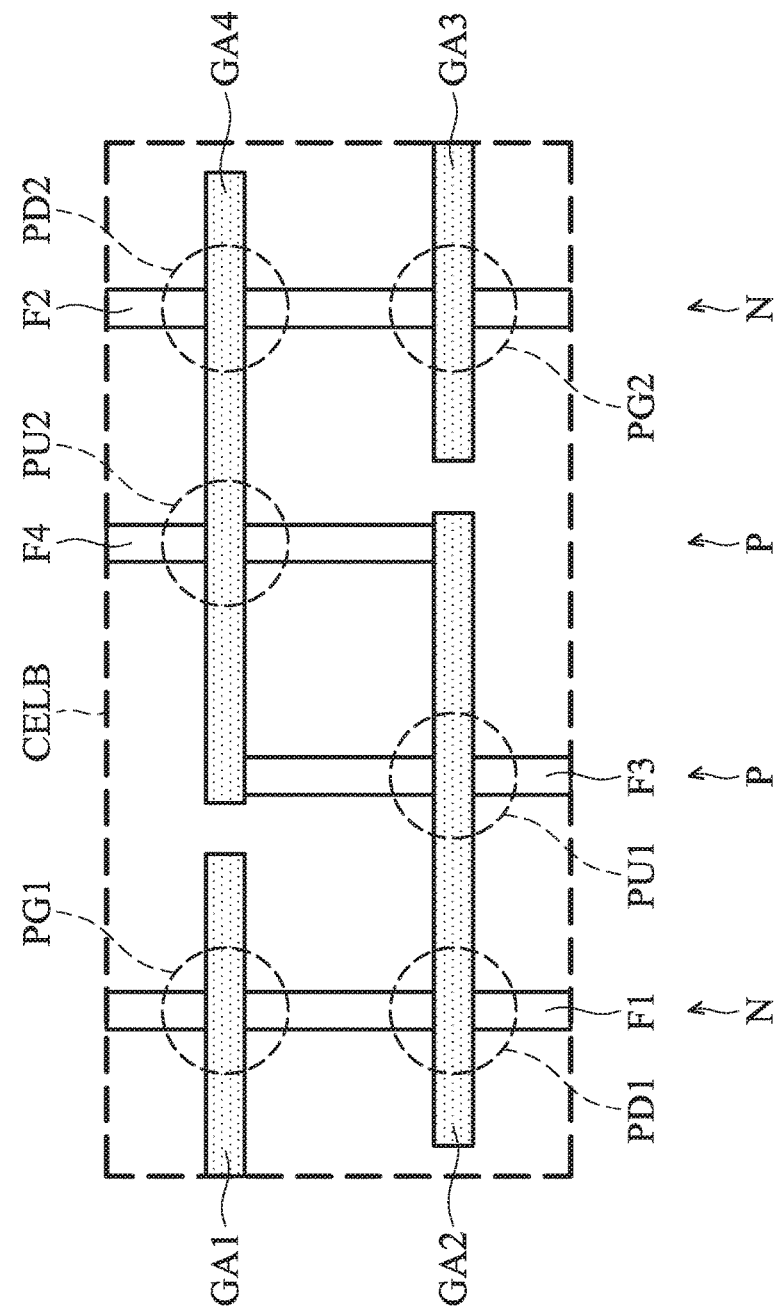
FIG. 1B is an exemplary layout of an SRAM unit cell according to one embodiment of the present disclosure.

FIG. 1B is an exemplary layout of an SRAM unit cell according to a first embodiment of the present disclosure. In FIG. 1B, only some of lower-layer elements are illustrated.

The SRAM unit cell is defined by a cell boundary CELB, and includes first to fourth fin structures F1, F2, F3 and F4, each extending in the Y (column) direction and arranged in the X (row) direction. The four fin structures F1, F3, F4 and F2 are arranged in the X direction in this order. The cell boundary CELB has a bottom side extending in the X direction, a top side extending in the X direction and opposing to the bottom side, a left side extending in the Y direction and a right side extending in the Y direction and opposing to the left side.

The SRAM unit cell includes six transistors. The first pass-gate device PG1 is a fin field effect transistor (Fin FET) (PG1) formed by a first gate electrode GA1 and the first fin structure F1. The first N-type FET device PD1 is a Fin FET formed by a second gate electrode GA2 and the first fin structure F1. The first P-type FET device PU1 is a Fin FET formed by the second gate electrode GA2 and the third fin structure F3. The second pass-gate FET device PG2 is a Fin FET formed by a third gate electrode GA3 and the second fin structure F2. The second N-type FET device PD2 is a Fin FET formed by a fourth gate electrode GA4 and the second fin structure F2. The second P-type FET device PU2 is a Fin FET formed by the fourth gate electrode GA4 and the fourth fin structure F4. All of the Fin FET in the SRAM unit cell includes only one active fin structure functioning as a channel and source/drain.

The SRAM device and SRAM unit cell further include upper layer structures such as contacts, vias and metal wirings, and the detailed explanation thereof is omitted in this disclosure.

Figure 1C:
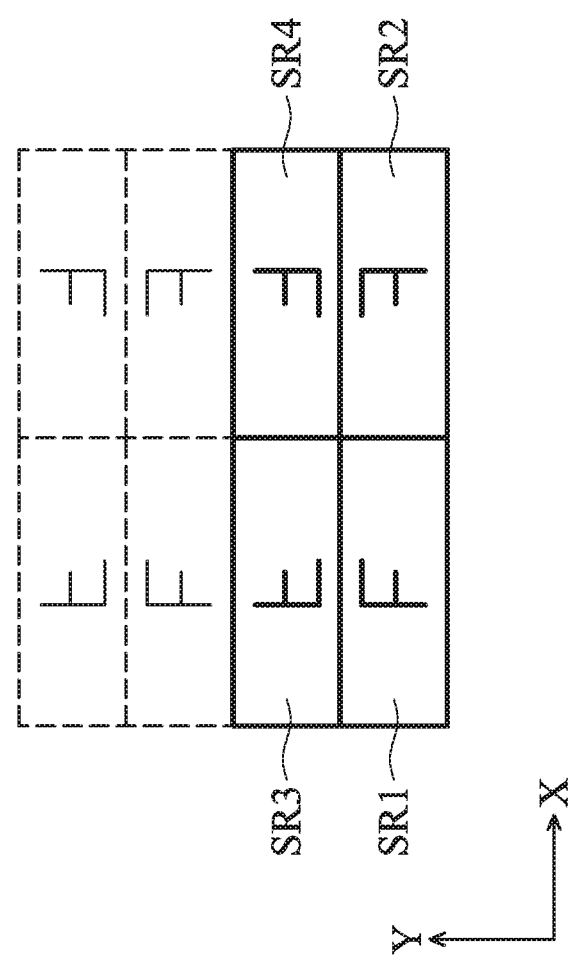
FIG. 1C is an exemplary arrangement of plural SRAM unit cells.

The SRAM device includes a plurality of SRAM unit cells arranged in the X (row) and Y (column) directions. FIG. 1C shows an exemplary layout of four SRAM unit cells, first to fourth SRAM unit cells, SR1, SR2, SR3 and SR4. The first SRAM SR1 has, for example, the layout structures shown by FIG. 2. The second SRAM SR2 has a layout which is a horizontally flipped layout of the first SRAM SR1 with respect to an axis parallel to the Y direction. The third SRAM SR3 has a layout which is a vertically flipped layout of the first SRAM SR1 with respect to an axis parallel to the X direction. The fourth SRAM SR4 has a layout which is a horizontally flipped layout of the third SRAM SR3 with respect to an axis parallel to the Y direction. Along the column direction (Y), plural first SRAMs SR1 and plural third SRAMs SR3 are alternatively arranged.

Figure 1D:
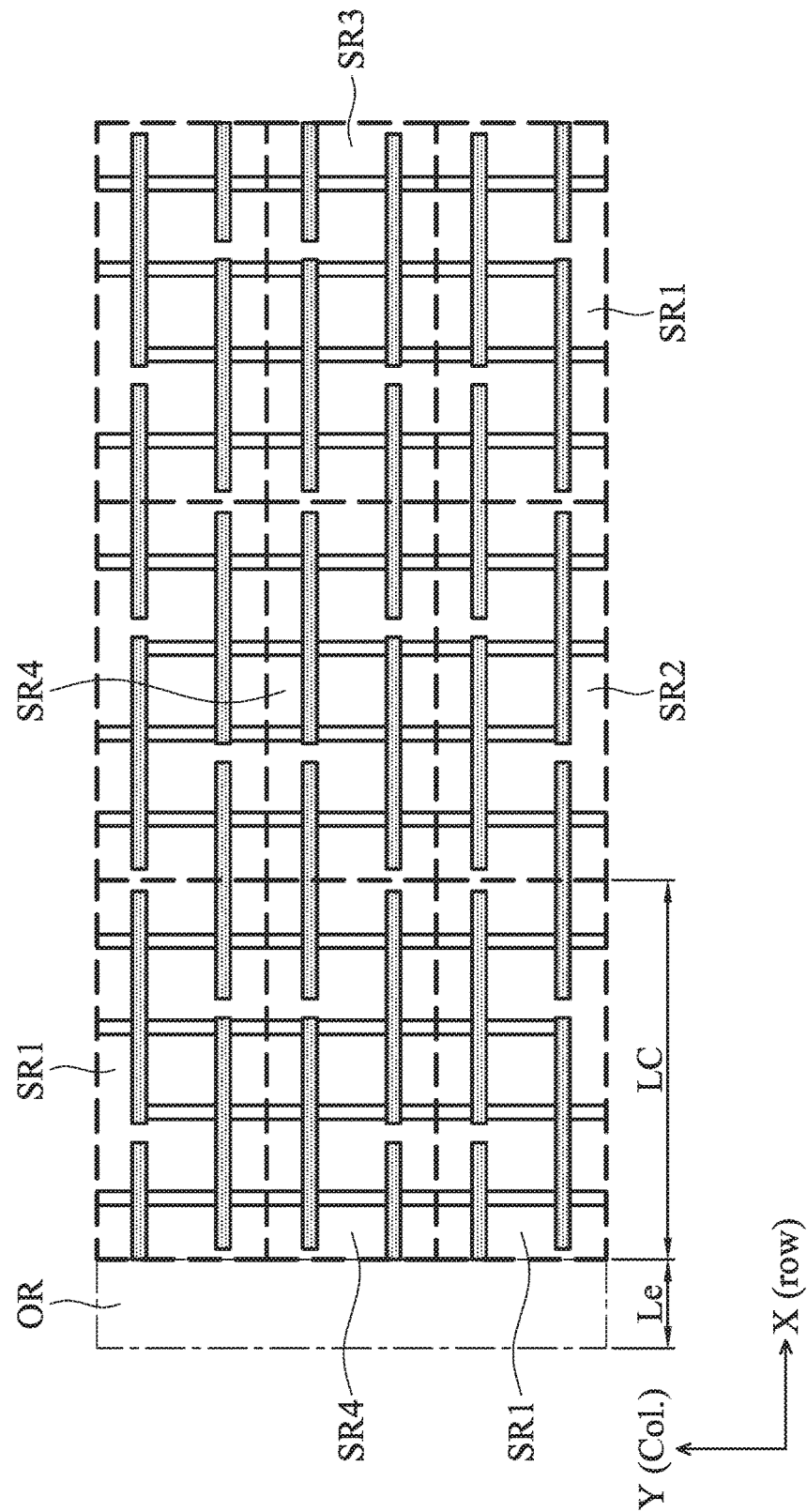
FIG. 1D is an exemplary arrangement of plural SRAM unit cells according to one embodiment of the present disclosure.

FIG. 1D shows an SRAM array showing 3 rows and 3 columns. Each SRAM unit cell has the layout structure of FIG. 1B and its flipped structures as set forth above.

As shown in FIG. 1D, the fin structures of one SRAM unit cell are connected to corresponding fin structures of the adjacent SRAM unit cells in the Y direction, thereby forming one continuous pattern, respectively. Similarly, the gate electrodes of one SRAM unit cell are connected to corresponding gate electrode of the adjacent SRAM unit cells in the X direction, thereby forming one continuous pattern, respectively.

Figure 1E:
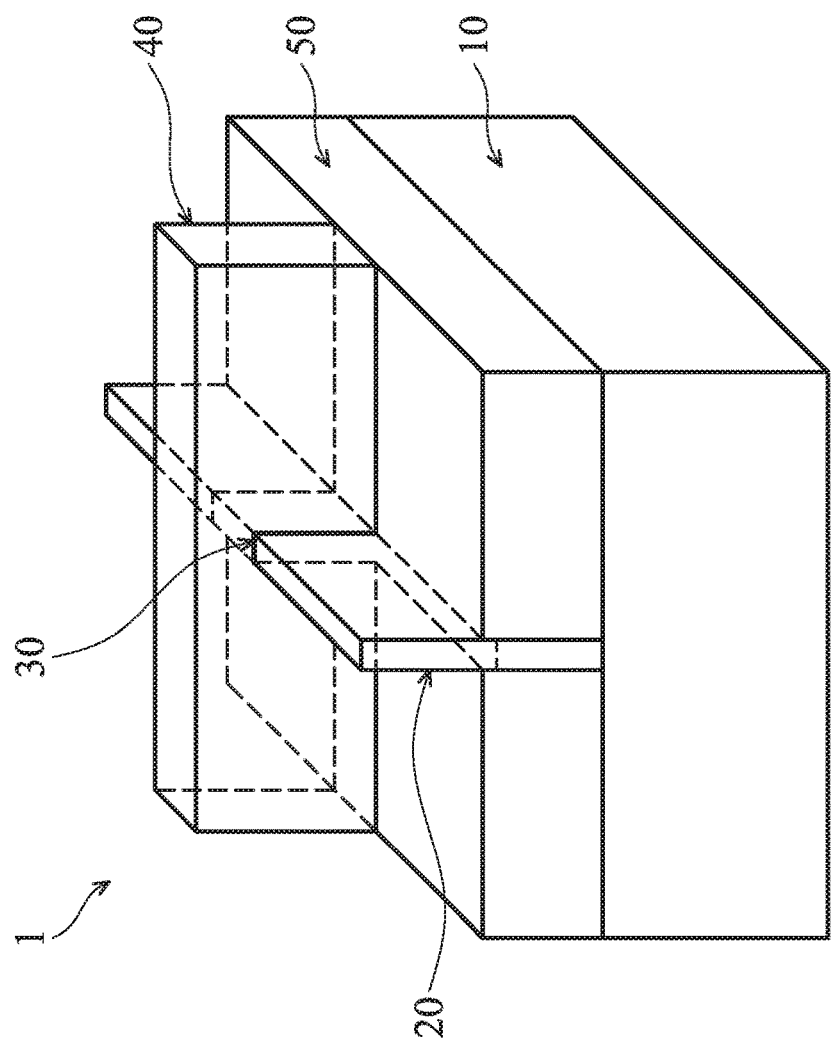
FIG. 1E shows an exemplary perspective view of a Fin FET.

FIG. 1E shows an exemplary perspective view of a Fin FET. The Fin FET 1 includes, among other features, a substrate 10, a fin structure 20, a gate dielectric 30 and a gate electrode 40. In this embodiment, the substrate 10 is a silicon substrate. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. The fin structure 20 is disposed over the substrate. The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The lower part of the fin structure 20 under the gate electrode 40 is referred to as a well region, and the upper part of the fin structure 20 is referred to as a channel region. Under the gate electrode 40, the well region is embedded in the isolation insulating layer 50, and the channel region protrudes from the isolation insulating layer 50. Spaces between the fin structures 20 and/or a space between one fin structure and another element formed over the substrate 10 are filled by an isolation insulating layer 50 (or so-called a "shallow-trench-isolation (STI)" layer) including an insulating material. The insulating material for the isolation insulating layer 50 may include silicon oxide, silicon nitride, silicon oxynitride (SiON), SiOCN, fluorine-doped silicate glass (FSG), or a low-k dielectric material.

The channel region protruding from the isolation insulating layer 50 is covered by a gate dielectric layer 30, and the gate dielectric layer 30 is further covered by a gate electrode 40. Part of the channel region not covered by the gate electrode 40 functions as a source and/or drain of the MOS FET.

In certain embodiments, the gate dielectric layer 30 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 40 includes any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In some embodiments, one or more work function adjustment layers (not shown) may be interposed between the gate dielectric layer and the gate electrode. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or any other suitable materials, or a multilayer of two or more of these materials. For the n-channel Fin FET, one or more of TaN, TaAlC, TiN, TiC, Co, TiAl, HfTi, TiSi and TaSi, or any other suitable materials, is used as the work function adjustment layer, and for the p-channel Fin FET, one or more of TiAlC, Al, TiAl, TaN, TaAlC, TiN, TiC and Co, or any other suitable materials, is used as the work function adjustment layer. The work function adjustment layer may be formed separately for the n-channel Fin FET and the p-channel Fin FET which may use different metal layers.

Source and drain regions are also formed in the fin structure 20 not covered by the gate electrode 40, by appropriately doping impurities in the source and drain regions or epitaxially growing appropriate material. An alloy of Si or Ge and a metal such as Co, Ni, W, Ti or Ta may be formed on the source and drain regions.

Figure 2A:
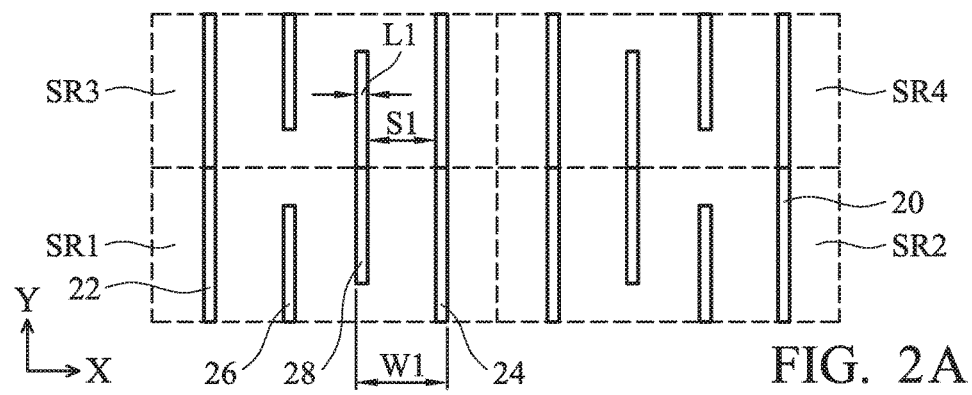
Figure 2B:
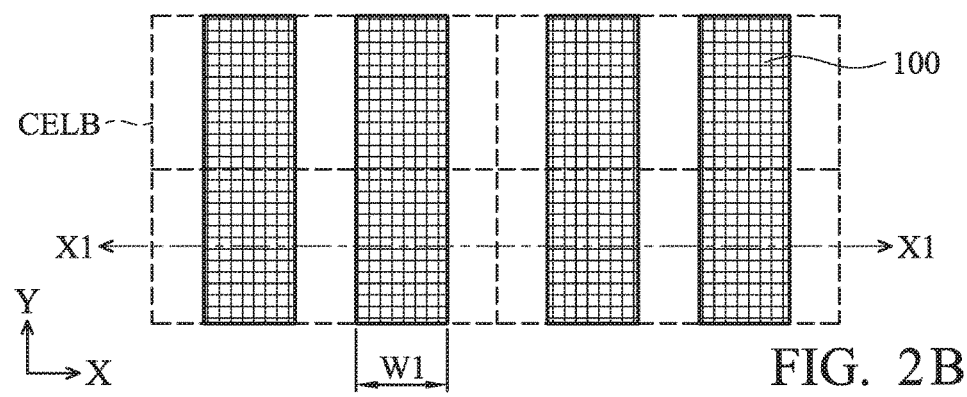

FIGS. 2A-12C show exemplary sequential processes for manufacturing fin structures for an SRAM device according to one embodiment of the present disclosure. FIGS. 2A, 3A, . . . 12A are all the same figure illustrating fin structure layout in four adjacent SRAM unit cells subsequently formed. FIGS. 2B, 3B, . . . 12B show plan views in each manufacturing stage and FIGS. 2C, 3C, . . . 12C show cross sectional views along X1-X1 or X2-X2 in FIGS. 2B, 3B, . . . 12B in each manufacturing stage. It is understood that additional operations may be provided before, during, and after processes shown by FIGS. 2A-12C, and some of the operations described below can be replaced or eliminated in additional embodiments of the method.

FIG. 2A shows fin structure layout in four adjacent SRAM unit cells subsequently formed. The layout of the four SRAM unit cells is the same as FIG. 1C.

In one SRAM unit cell, for example, SR1, four fin structures 22, 24, 26 and 28, which correspond to first to fourth fin structures of FIG. 1B, respectively, are provided. The fin structures extend in the second direction (Y direction) and arranged in the first direction (X direction).

Within one cell, i.e., within one cell boundary, the first fin structure 22 extends between a bottom side of the cell boundary and a top side of the cell boundary opposite to the bottom side. The second fin structure 24 extends between the bottom side of the cell boundary and the top side of the cell boundary opposite to the bottom side. The third fin structure 26 extends from the bottom side, and is shorter than the first fin structure. The fourth fin structure 28 extends from the top side, and is shorter than the second fin structure. The first to fourth fin structures are arranged in the X direction with predetermined spacing. The predetermined spacing is constant in this embodiment. In other embodiments, the spacing between the first and third fin structures may be different from the spacing between the third and fourth fin structures.

The width L1 of the fin structures is in a range from about 20 nm to 80 nm in some embodiments and is a range from about 5 nm to about 30 nm in other embodiments. The space S1 between adjacent fin structures is in a range from about 20 nm to about 100 nm in some embodiments, and in a range from about 30 nm to about 80 nm in other embodiments.

Figure 2C:
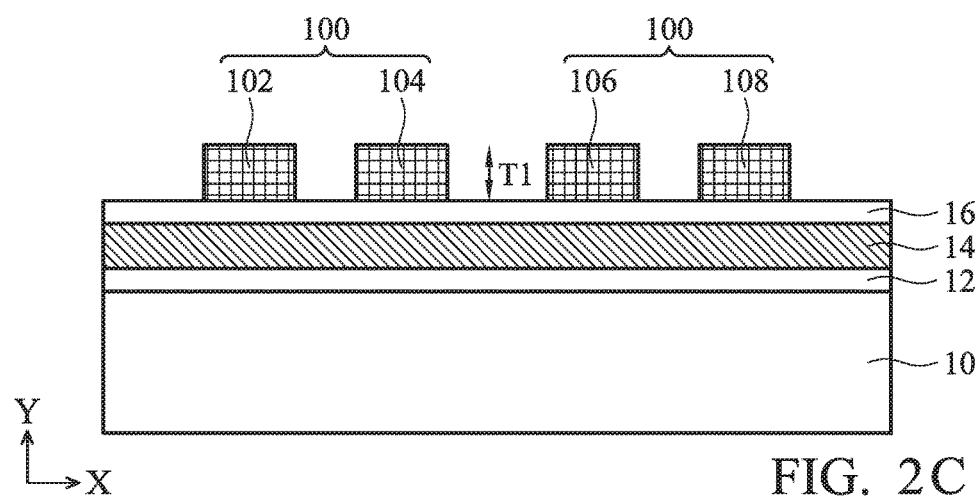
Figure 3A:
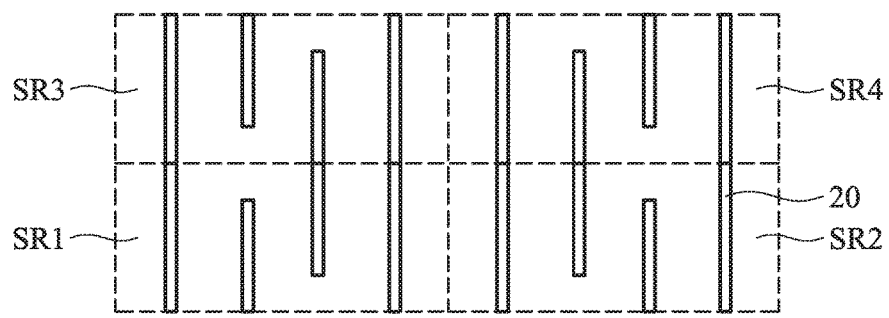
Figure 3B:
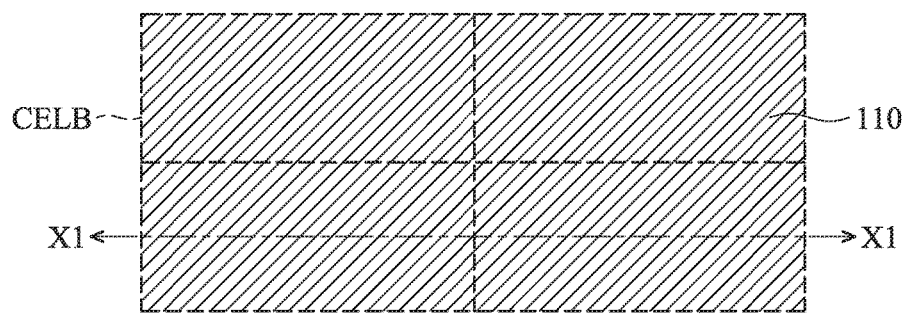

As shown in FIGS. 2B and 2C, a first mask layer 12, a second mask layer 14 and a third mask layer 16 are formed over the substrate 10. Each of the first and third mask layers includes one or more layers of $SiO_2$, SiN, SiON, SiCN or SiOCN. In one embodiment, the first mask layer 12 includes an $SiO_2$ underlying layer and an SiN layer disposed on the underlying $SiO_2$ layer and an upper $SiO_2$ layer disposed on the SiN layer. The third mask layer 16 includes an SiN layer and an $SiO_2$ layer disposed on the SiN layer. The second mask layer 14 includes one or more layer of a material having a high etching selectivity with respect to silicon oxide. In one embodiment, the second mask layer 14 includes a poly-silicon layer.

A first dummy pattern 100 is formed over the third mask layer 16. The first dummy pattern 100 is made of one or more layers of organic materials, or inorganic materials. In one embodiment, the first dummy pattern 100 includes poly-silicon. A blanket layer of a first material is formed over the third mask layer 16 and then a patterning operation including a lithography operation and/or an etching operation is performed to form the first dummy patterns 100. Within the cell boundary of one SRAM unit cell, only two first dummy patterns having the same width are included in some embodiments.

The blanket layer for the first dummy pattern 100 is formed by chemical vapor deposition (CVD), physical vapor deposition (PVD) or atomic layer deposition (ALD) can be used to form the blanket layer.

The first dummy patterns 100 are formed in a lines-and-spaces pattern extending in the Y direction. The width W1 of the first dummy pattern 100 is adjusted to about 2L1+S1. As shown in FIGS. 2A and 2B, the left edge the first dummy pattern 100 substantially corresponds to the left edge of the first fin structure 22 (or the fourth fin structure 28) and the right edge of the first dummy pattern 100 substantially corresponds to the right edge of the third fin structure 26 (or the second fin structure 24).

The thickness T1 of the first dummy pattern 100 is in a range from about 30 nm to about 100 nm.

After the first dummy patterns 100 are formed, a blanket layer 110 of a second material is formed over the first dummy patterns 100. The second material is an inorganic material, such as silicon oxide and silicon nitride and is different from the first material. In this embodiment, silicon nitride formed by CVD is used.

The thickness T2 of the second material from the upper surface of the third mask layer 16 is in a range from about 30 nm to about 200 nm.

Figure 3C:
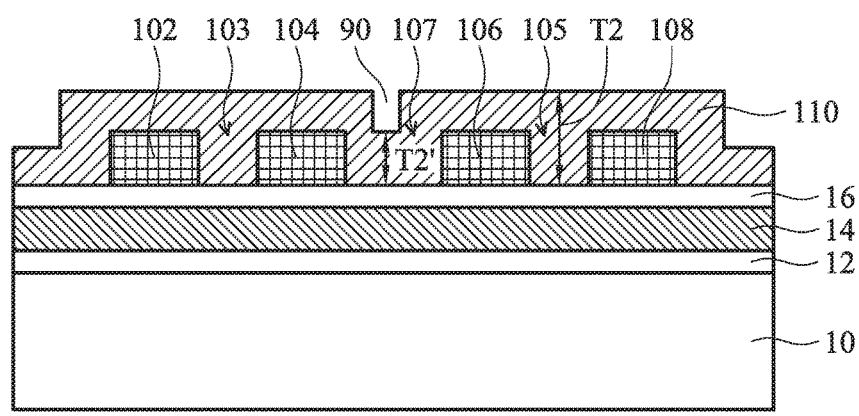

The spaces 103 and 105 between the first dummy patterns 102 and 104 and between the first dummy patterns 106 and 108 within the cell boundary in the X direction are fully filled by the second material. In some embodiments, as shown in FIG. 3C, depending on the space 107 between the first dummy patterns 104 and 106 across the call boundary of the adjacent SRAM unit cells in the X direction, a recess 90 is formed above the space 107. For example, when the space 107 is equal to or greater than about 65 nm, the recess 90 is formed. In this space the thickness T2' of the second material is substantially the same as the thickness of the second material on the first dummy patterns, which is in a range from about 30 nm to about 100 nm.

Figure 4A:
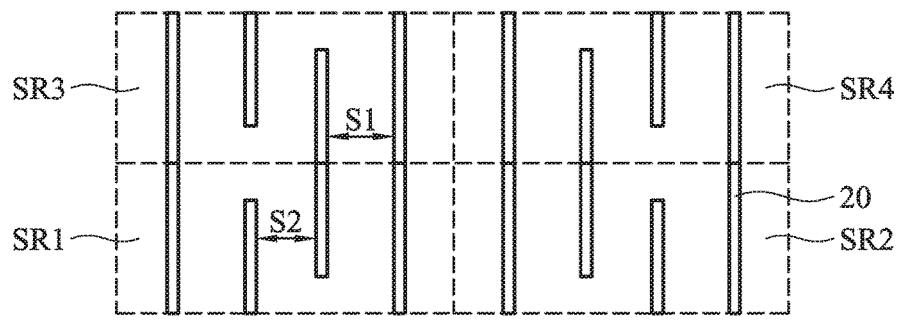
Figure 4B:
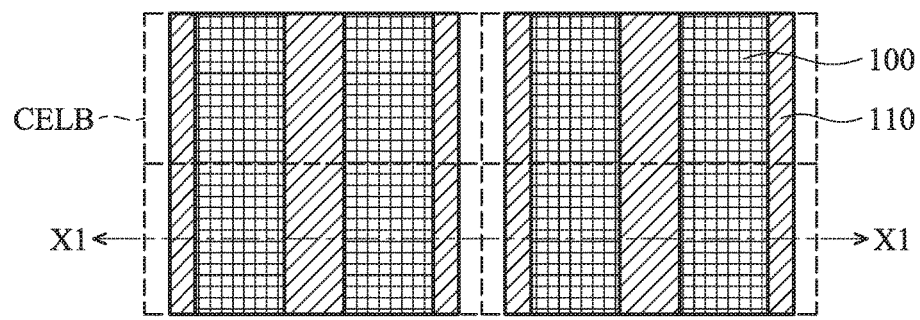
Figure 4C:
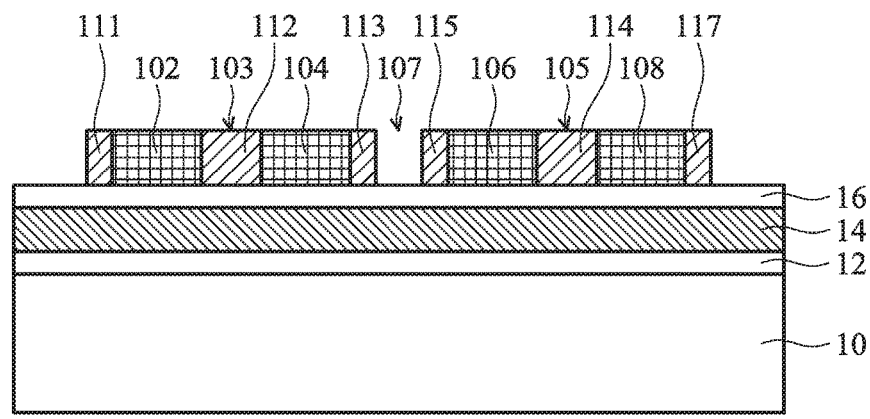

Next, anisotropic etching is performed on the blanket layer of the second material. As shown in FIGS. 4B and 4C, the space 103 and 105 between the first dummy patterns 102 and 104 and between the first dummy patterns 106 and 108 are fully filled by the second material forming intermediate dummy patterns 112 and 114. The second material also remains as sidewall spacer on the left side of the first dummy patterns 102 and 106 and on the right side of the first dummy patterns 104 and 108, thereby forming additional intermediate dummy patterns 111, 113, 115 and 117.

Figure 5A:
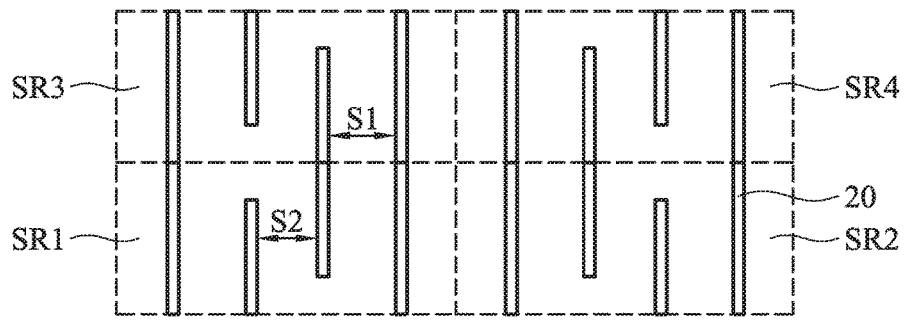
Figure 5B:
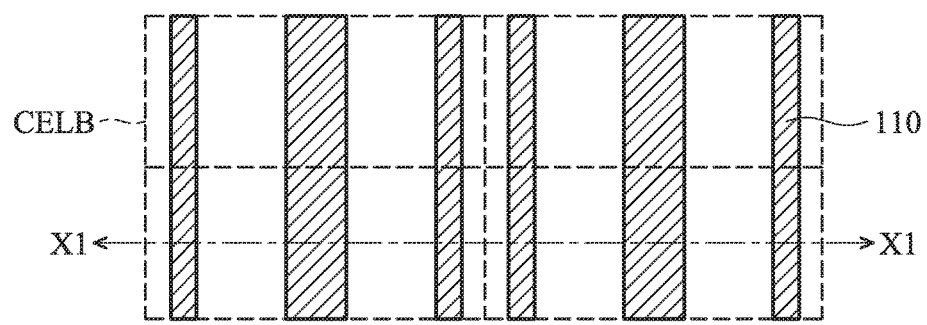
Figure 5C:
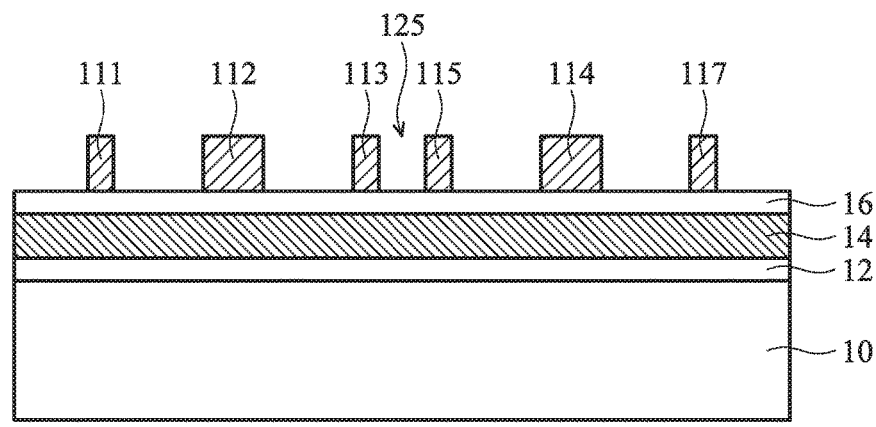

Next, as shown in FIGS. 5B and 5C, the first dummy patterns are removed by dry and/or wet etching. After the removal of the first dummy patterns, intermediated dummy patterns 111, 112, 113, 115, 114 and 117 extending in the Y direction are formed in this order in the X direction.

Figure 6A:
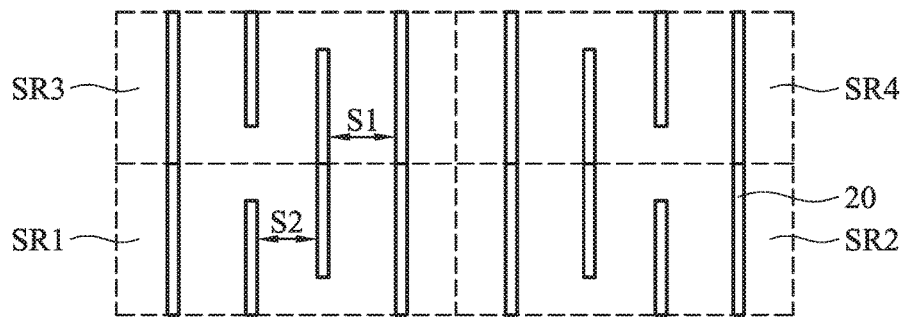
Figure 6B:
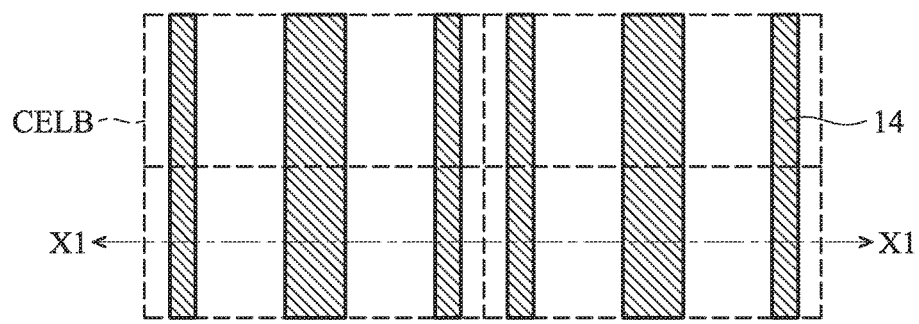
Figure 6C:
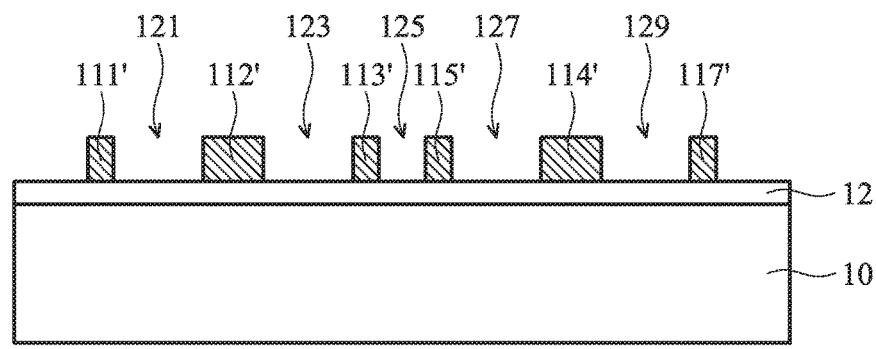

Then, as shown in FIGS. 6B and 6C, by using the intermediate dummy patterns as an etching mask, the third mask layer 16 is patterned, and subsequently, by using the patterned third mask layer, the second mask layer 14 is patterned into second dummy patterns 111', 112', 113', 115', 114' and 117', separated by spaces 121, 123, 125, 127 and 129, respectively. After the etching of the second mask layer, the patterned third mask layer 16 is removed.

The widths of the second dummy patterns 112' and 114' are substantially the same as each other and substantially the same as the width of the first dummy patterns 100, and the widths of the second dummy patterns 111', 113', 115' and 117' are substantially the same as each other and smaller than the widths of second dummy patterns 112' and 114'. The width of the second dummy patterns 112' and 114' is substantially the same as a space S2 between the third and fourth fin structures. When the first to fourth fin structures are arranged by an equal interval within one unit cell, the space S1 is equal to the space S2.

As set forth above, the width of the first dummy pattern 100 is 2L1+S1. By the operations described above, patterns (second dummy patterns) which have a smaller line width (S1 or S2), which may be beyond a resolution limit of optical lithography, can be obtained. Even if the dimension S1 or S2 is not beyond the resolution limit, a process margin in the patterning operation for the first dummy patterns 100 can be increased.

Figure 7A:
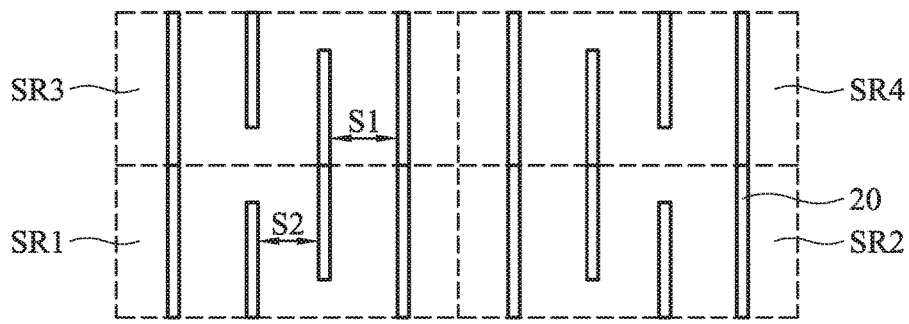
Figure 7B:
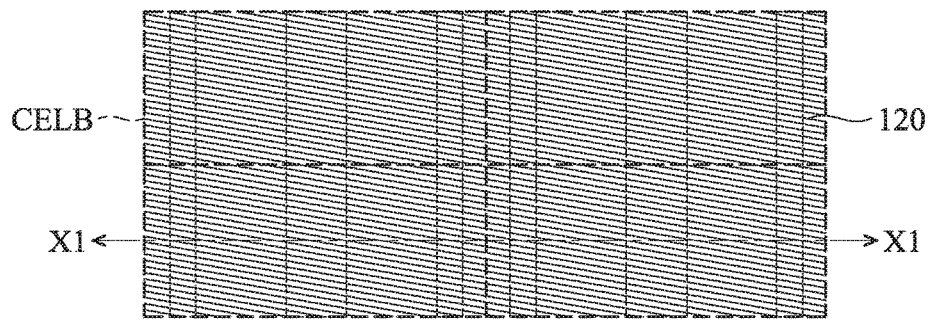
Figure 7C:
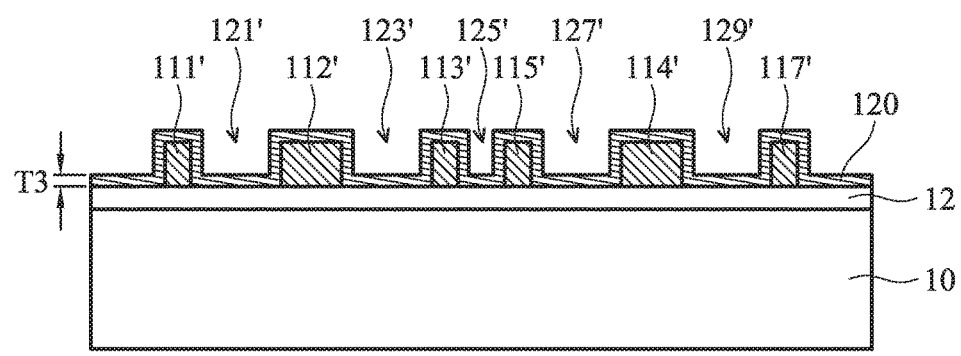

Then, as shown in FIGS. 7B and 7C, a blanket layer 120 of a third material is formed over the second dummy patterns. The third material is an inorganic material, such as silicon oxide, silicon nitride, or poly silicon, and is different from the second material. In this embodiment, silicon oxide formed by CVD is used. The thickness T3 of the third material from the upper surface of the first mask layer 12 is in a range from about 5 nm to about 50 nm.

Since the thickness of the third material layer is sufficiently smaller than the spaces of the second dummy patterns, the third material layer does not fully fill the spaces and is conformally formed over the second dummy patterns.

Figure 8A:
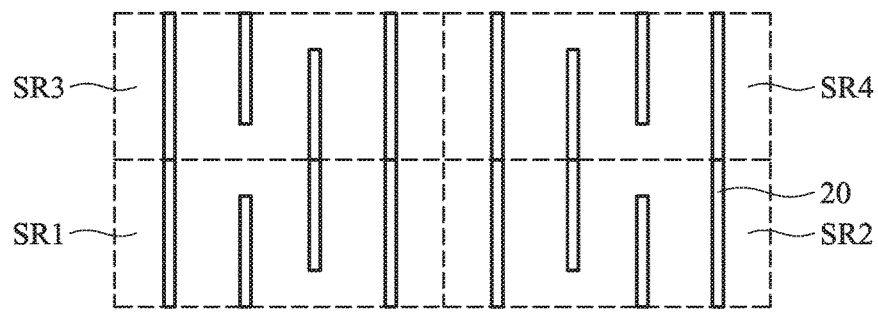
Figure 8B:
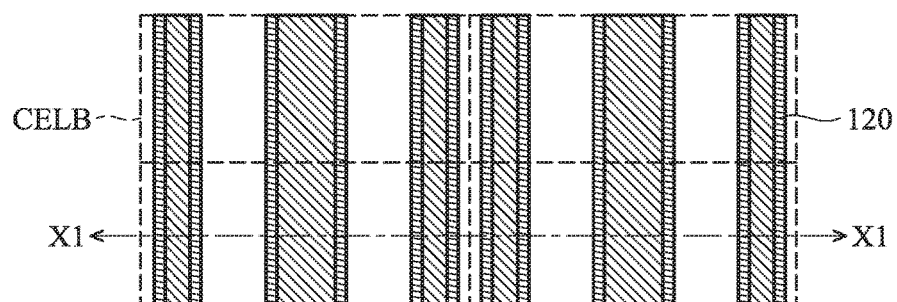
Figure 8C:
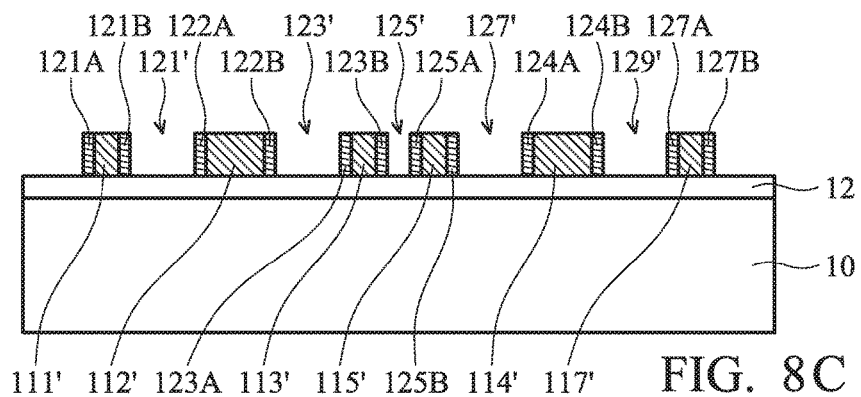
Figure 9A:
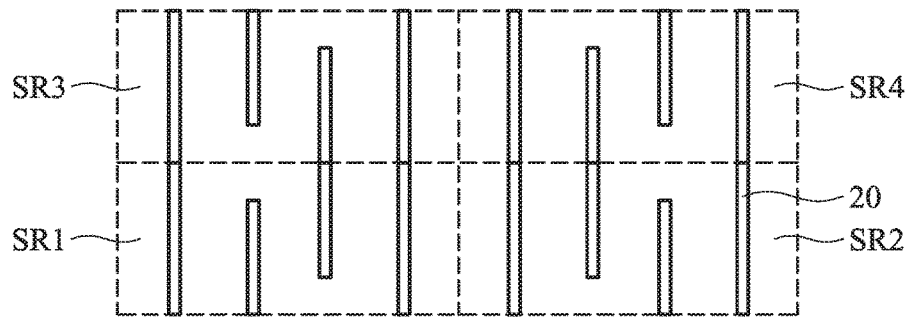
Figure 9B:
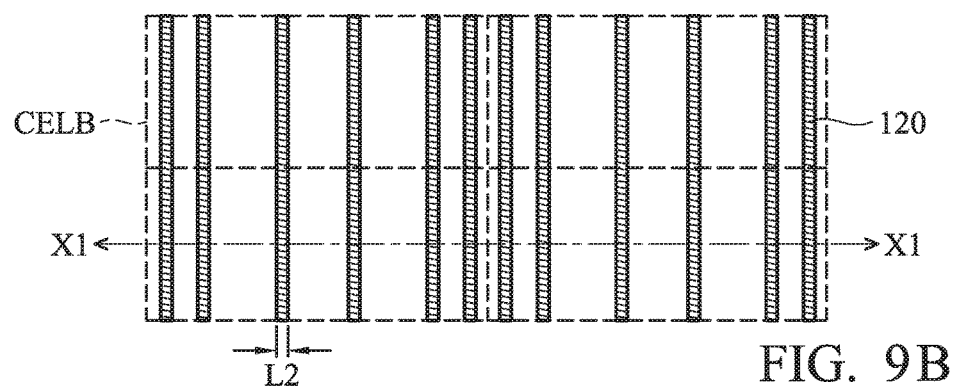
Figure 9C:
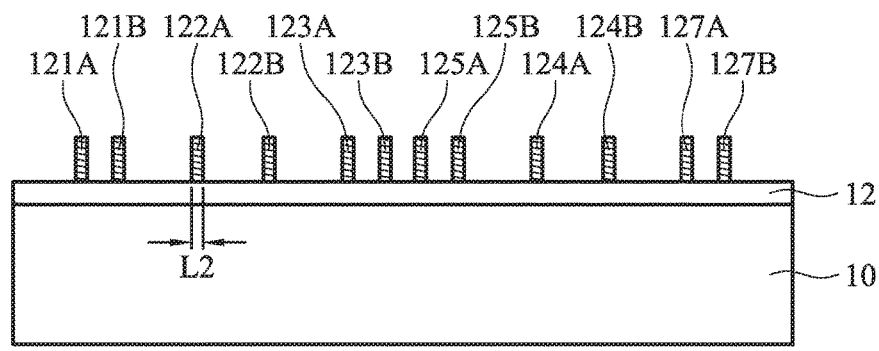
Figure 10:
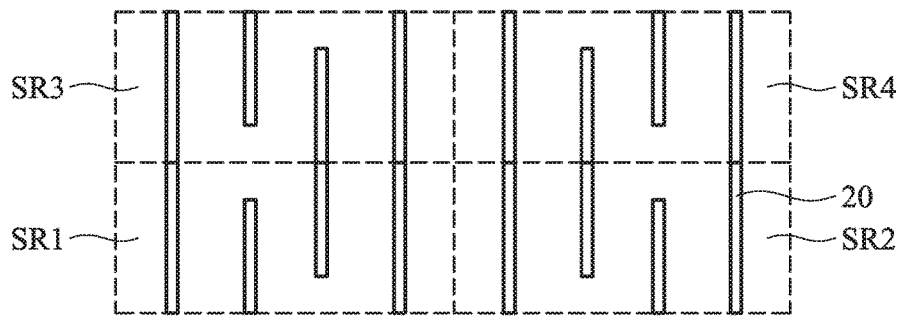
Figure 10:
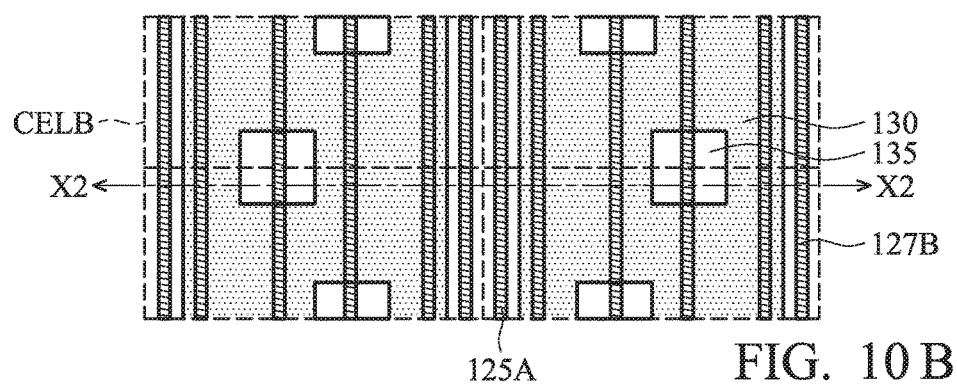
Figure 10:
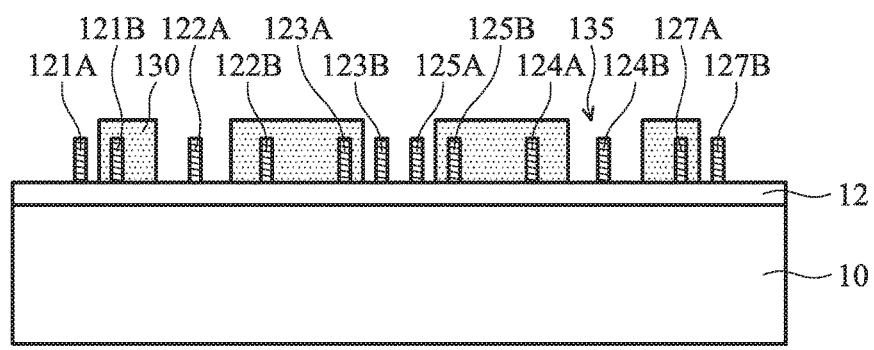
Figure 11:
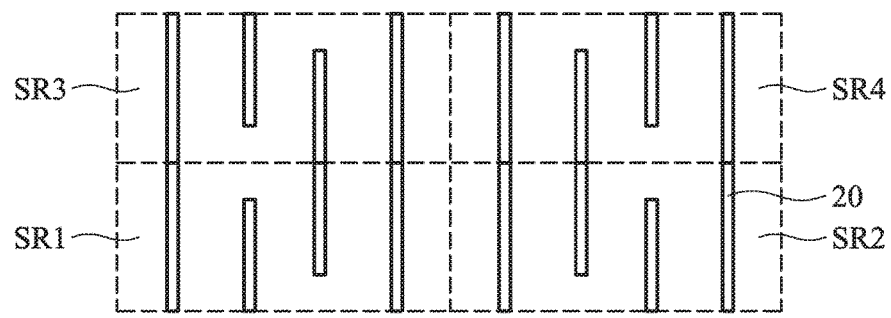
Figure 11:
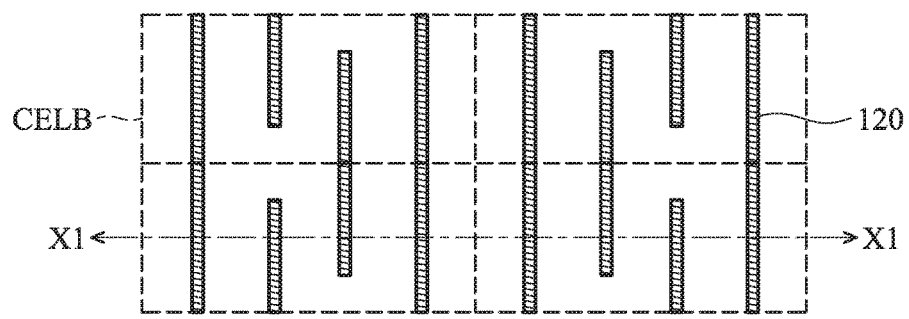
Figure 11:
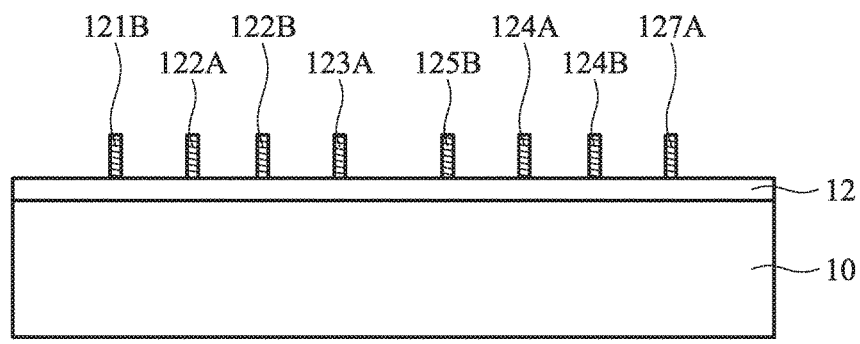
Figure 12:
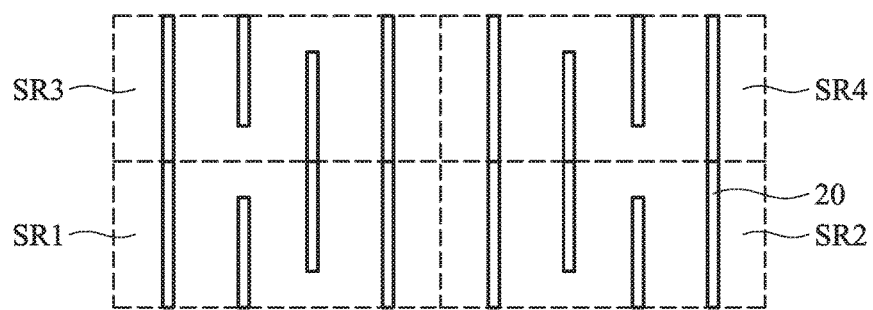
Figure 12:
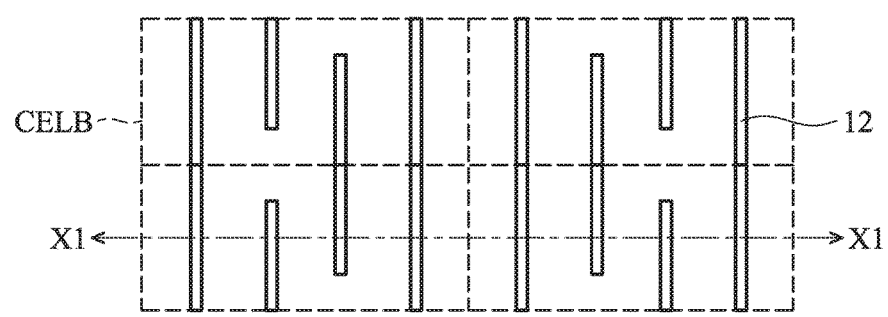
Figure 12:
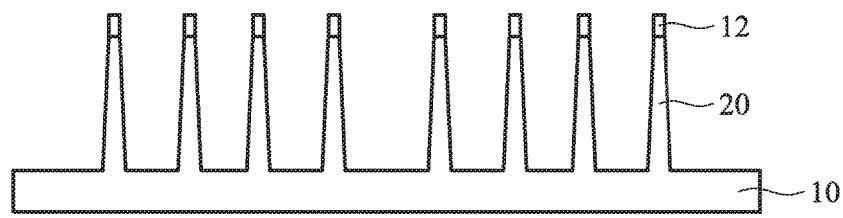
Figure 13:
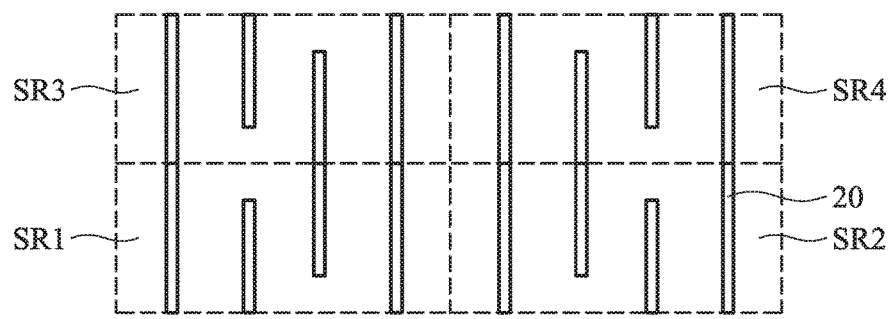
Figure 13:
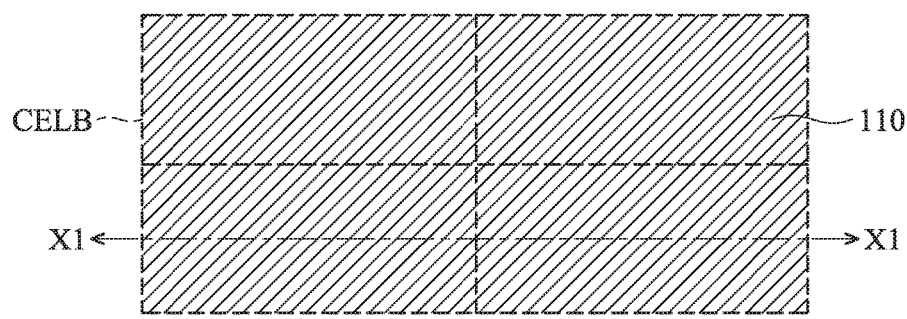
Figure 13:
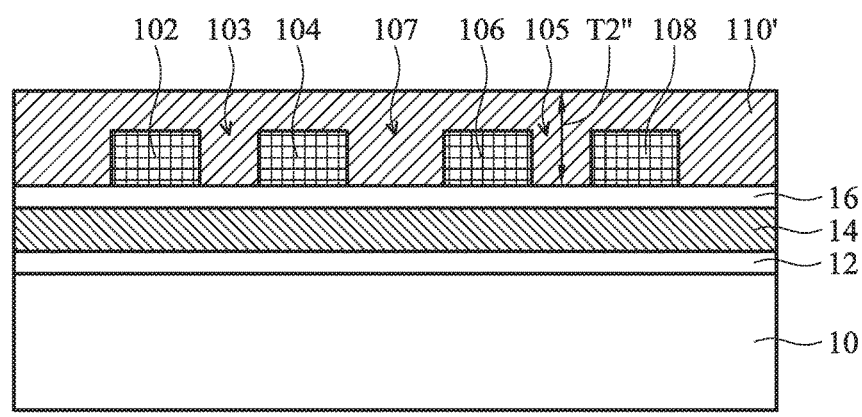
Figure 14:
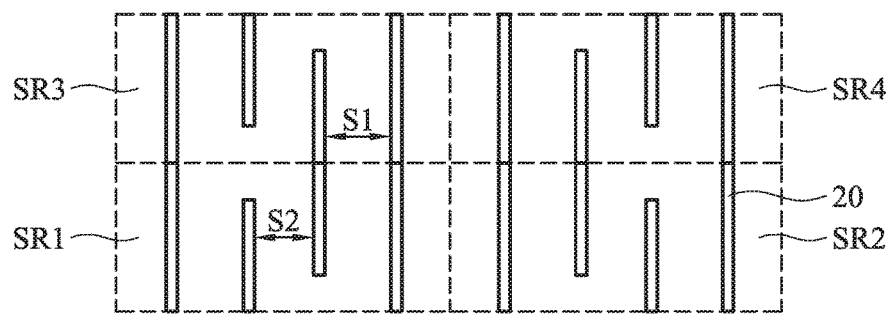
Figure 14:
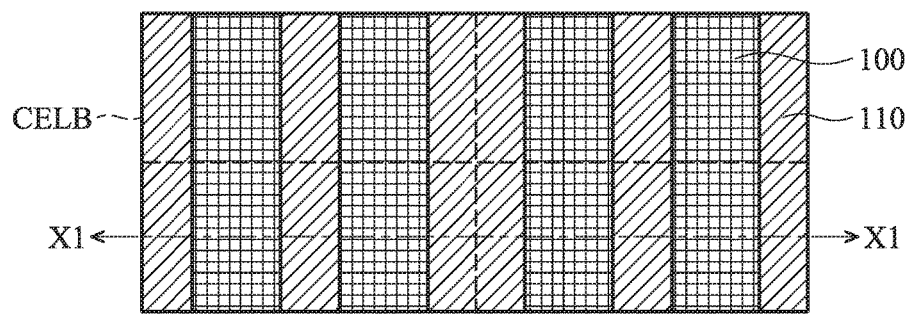
Figure 14:
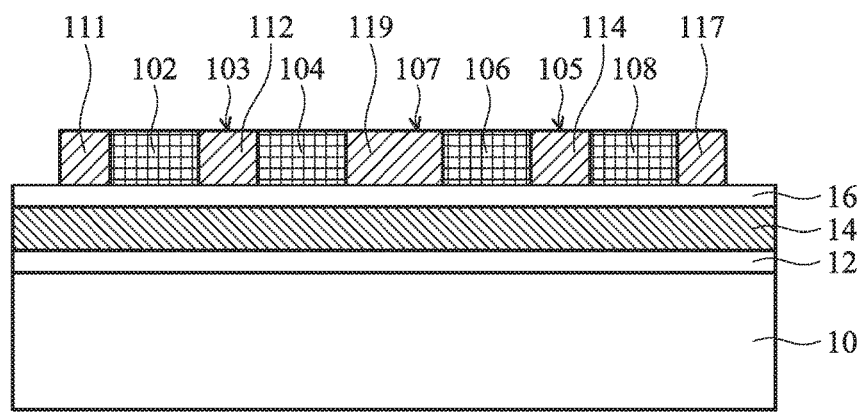

Next, anisotropic etching is performed on the blanket layer of the third material. As shown in FIGS. 8B and 8C, the third material remains as sidewall spacers on the left and right sides of the second dummy patterns, and after removing the second dummy patterns, mask patterns 121A, 121B, 122A, 122B, 123A, 123B, 124A, 124B, 125A, 125B, 128A and 128B are formed as shown in FIGS. 9B and 9C.

The width L2 of the mask patterns is substantially the same as or slightly larger than the width L1 of the fin structures eventually formed. The width L2 is in a range from about 7 nm to about 20 nm.

By adjusting the thickness and/or dimensions of the blanket layers of first, second and third materials and the first and second dummy patterns, the desired width and locations of the mask pattern can be obtained.

Next, as shown in FIGS. 10B and 10C, resist pattern 130 having openings 135 is formed over the mask patterns. FIG. 10C is the cross sectional view along line X2-X2 of FIG. 10B. The mask patterns 121A, 123B, 125B and 128B, which are located adjacent to the cell boundary in the X direction and parts of the mask patterns 122A, 122B, 124A and 124B are exposed via the openings 135.

Then, the exposed portions of the mask patterns are removed by etching operations and the resist pattern 130 is removed. As shown in FIGS. 11B and 11C, the mask patterns 121B, 122A, 122B, 123A, 125B, 124A, 124B and 128A corresponding to the fin structures to be formed remain on the substrate 10. The space between adjacent mask patterns within the cell boundary is constant in this embodiment.

By using the mask patterns 121B, 122A, 122B, 123A, 125B, 124A, 124B and 128A as etching masks, the first mask layer 12 is patterned, and then by using the patterned first mask layer 12 as an etching mask, trench etching is performed on the substrate 10, thereby forming fin structures 20, as shown in FIGS. 12B and 12C.

As set forth above, in this embodiment, the mask patterns 121A, 123B, 125B and 128B, which are located adjacent to the cell boundary in the X direction are removed. Accordingly, no fin structures are formed adjacent to the cell boundary. In particular, when an SRAM array is formed by m-rows×n-columns matrix of SRAM unit cells (m and n are natural numbers of 2 or more), the outside region OR outside of the SRAM array in the X direction (see, FIG. 1D) does not contain any fin structures. As shown in FIG. 1D, the outside region OR is defined as a region having a width Le in the X direction, which is ¼ of the width Lc of one SRAM unit cell in the X direction.

In the alternative, the second and third mask layer may not necessarily be used. In such a case, first dummy patterns are formed over a substrate, second dummy patterns are formed on sidewalls of the first dummy patterns to fill space between the first dummy patterns, and the first dummy patterns are removed, thereby leaving the second dummy patterns over the substrate. Sidewall spacer layers are formed on sidewalls of the second dummy patterns. The second dummy patterns are removed, thereby leaving the sidewall spacer layers as hard mask patterns over the substrate. The substrate is patterned by using the hard mask patterns as an etching mask.

FIGS. 13A-16C show exemplary sequential processes for manufacturing fin structures for an SRAM device according to another embodiment of the present disclosure. FIGS. 13A, 14A, 15A and 16A are all the same figures as FIG. 2A illustrating fin structure layout in four adjacent SRAM unit cells subsequently formed. FIGS. 13B, 14B, 15B and 16B show plan views in each manufacturing stage and FIGS. 13C, 14C, 15C and 16C show cross sectional views along X1-X1 in FIGS. 13B, 14B, 15B and 16B in each manufacturing stage. It is understood that additional operations may be provided before, during, and after processes shown by FIGS. 13A-16C, and some of the operations described below can be replaced or eliminated in additional embodiments of the method.

This embodiment is substantially similar to the aforementioned embodiment, except for FIGS. 3B, 3C to 9B, 9C.

Unlike FIGS. 3B and 3C, a thicker blanket layer 110' of a second material is formed over the first dummy patterns 100, as shown in FIG. 13C.

By using a planarization operation such as an etch-back operation or a chemical mechanical polishing (CMP) operation, the upper portion of the second material layer is removed, so that the second material is fully filled in the spaces 103, 105 and 107, as shown in FIGS. 14B and 14C. Unlike FIG. 4C, the intermediate dummy pattern 119 is formed in the space 107. In particular, when the space 107 is equal to or less than about 50 nm, the space 107 is fully filled by the second material.

Figure 15A:
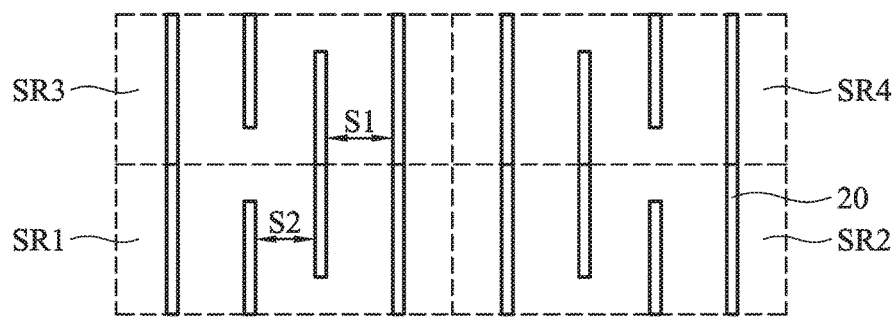
Figure 15B:
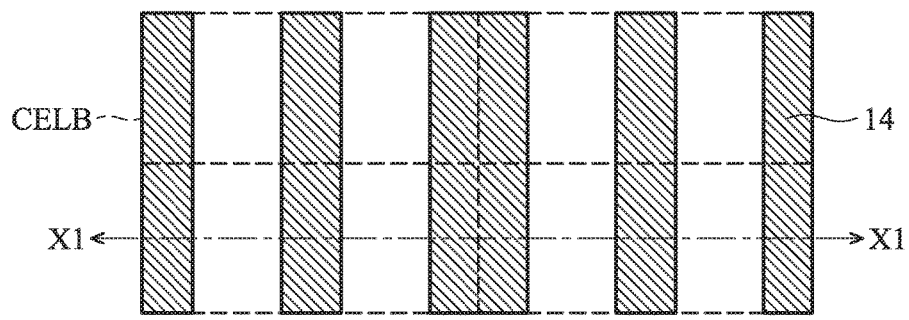
Figure 15C:
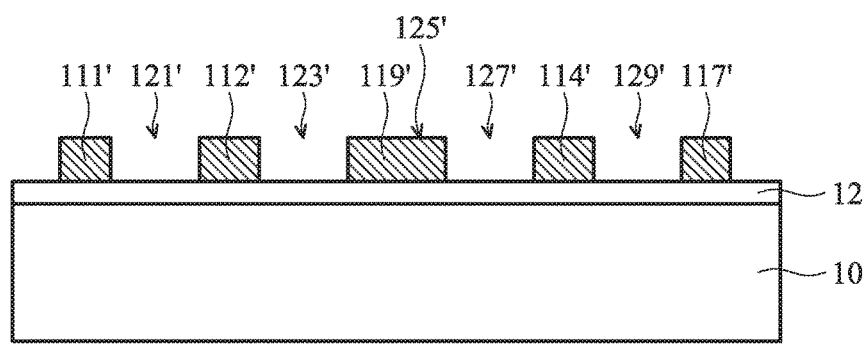

Then, the first dummy patterns 100 are removed, leaving the intermediate dummy patterns 111, 112, 119, 114 and 117, and then second dummy patterns 111', 112', 119', 114' and 117' are formed by using the intermediate dummy pattern as an etching mask, as shown in FIGS. 15B and 15C.

Figure 16A:
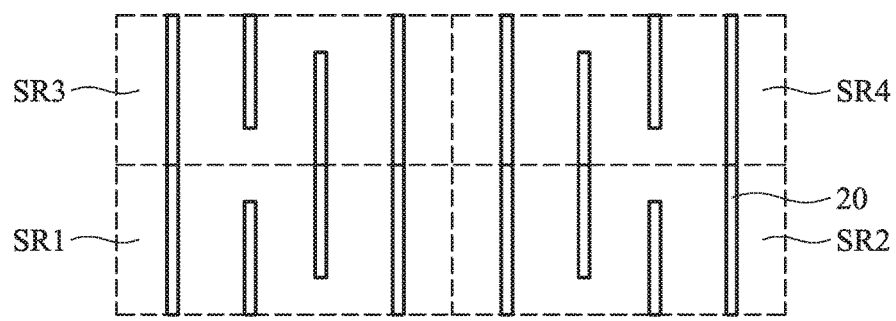
Figure 16B:
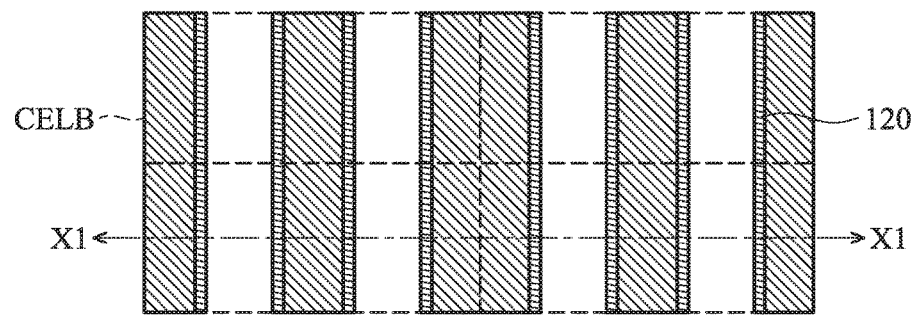
Figure 16C:
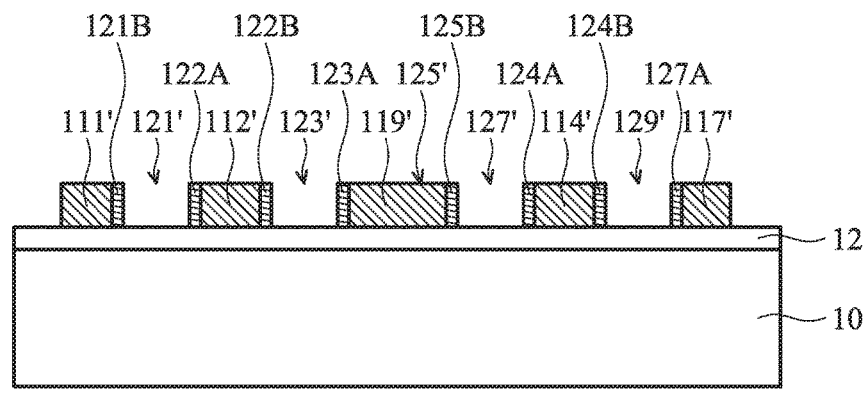

Similar to FIGS. 7B, 7C and 8B and 8C, a blanket layer of a third material is formed over the second dummy patterns, followed by anisotropic etching performed on the blanket layer of the third material. As shown in FIGS. 16B and 16C, the third material remains as sidewall spacers on the left and right sides of the second dummy patterns, and after removing the second dummy patterns, mask patterns 121B, 122A, 122B, 123A, 124A, 124B, 125B, 128A and 128B are formed as shown in FIGS. 16B and 16C.

Then, similar to FIGS. 10B and 10C, the second dummy patterns are removed, leaving the mask patterns 121B, 122A, 122B, 123A, 124A, 124B, 125B, 128A and 128B. After that, the same or similar operations with respect to FIGS. 11B, 11C to 12B, 12C are performed, and the fin structures are obtained.

In this embodiment, unlike FIGS. 9B and 9C, no hard masks are formed around the cell boundary. If extra hard masks are formed in the outside region OR, such extra hard masks can be removed by the patterning operations of FIGS. 10B and 10C.

The various embodiments or examples described herein offer several advantages over the existing art. For example, in the present disclosure, patterns (second dummy patterns) which have a smaller line width (S1 or S2), which may be beyond a resolution limit of optical lithography, can be obtained. Even if the dimensions S1 or S2 are not beyond the resolution limit, a process margin in the patterning operation for the first dummy patterns can be increased.

It will be understood that not all advantages have been necessarily discussed herein, no particular advantage is required for all embodiments or examples, and other embodiments or examples may offer different advantages.

In accordance with one aspect of the present disclosure, a method of manufacturing a static random access memory (SRAM) including a plurality of SRAM cells, comprises the following operations. First dummy patterns are formed over a substrate, on which a first mask layer, a second mask layer and a third mask layer are formed in this order. Intermediate dummy patterns are formed on sidewalls of the first dummy patterns to fill space between the first dummy patterns. The first dummy patterns are removed, thereby leaving the intermediate dummy patterns over the third mask layer of the substrate. The third mask layer is patterned by using the intermediate dummy patterns. The second mask layer is patterned by using the patterned third mask layer, thereby forming second dummy patterns. Sidewall spacer layers are formed on sidewalls of the second dummy patterns. The second dummy patterns are removed, thereby leaving the sidewall spacer layers as hard mask patterns over the substrate. The first mask layer is patterned by using the hard mask patterns as an etching mask. The substrate is patterned by using the patterned first mask layer as an etching mask. Each of the plurality of SRAM cells is defined by a cell boundary. Within the cell boundary, only two first dummy patterns are included.

In accordance with another aspect of the present disclosure, a method of manufacturing a static random access memory (SRAM) including a plurality of SRAM cells is provided. Each of the plurality of SRAM cells is defined by a cell boundary having a bottom side extending in a first direction, a top side extending in the first direction and opposing to the bottom side, a left side extending in a second direction crossing the first direction and a right side extending in the second direction and opposing to the left side. Each of the plurality of SRAM cells includes: a first fin structure extending from the first side to the second side in the second direction; a second fin structure extending from the first side toward the second side in the second direction, the second fin structure being shorter than the first fin structure in the second direction; a third fin structure extending from the second side toward the first side in the second direction, the third fin structure being shorter than the first fin structure in the second direction; and a fourth fin structure extending from the first side to the second side in the second direction. The method comprises patterning a substrate by using first hard masks formed in the substrate, thereby forming the first to fourth fin structures. The first hard mask patterns are formed by: forming first dummy patterns on the substrate; forming a blanket layer of a first material over the first dummy patterns; etching the blanket layer of the first material, thereby forming the first mask patterns on sidewalls of the first dummy patterns; and removing the first dummy patterns, thereby leaving the first hard mask patterns. The first dummy patterns are formed by: forming second dummy patterns on the substrate, on which a first mask layer, a second mask layer and a third mask layer are formed in this order; forming a blanket layer of a second material over the second dummy patterns; etching the blanket layer of the second material, thereby forming the intermediate dummy patterns on sidewalls of the second dummy patterns and between the second dummy patterns; removing the second dummy patterns, thereby leaving the intermediate dummy patterns; patterning the third mask layer by using the intermediate dummy patterns as an etching mask; and patterning the second mask layer by using the patterned third mask layer as an etching mask, thereby forming the first dummy patterns. Within the cell boundary of one SRAM cell, only two second dummy patterns are included.

In accordance with another aspect of the present disclosure, a static random access memory (SRAM) includes a plurality of SRAM cells. Each of the plurality of SRAM cells is defined by a cell boundary having a bottom side extending in a first direction, a top side extending in the first direction and opposing to the bottom side, a left side extending in a second direction crossing the first direction and a right side extending in the second direction and opposing to the left side. Each of the plurality of SRAM cells includes: a first fin structure extending from the first side to the second side in the second direction; a second fin structure extending from the first side toward the second side in the second direction, the second fin structure being shorter than the first fin structure in the second direction; a third fin structure extending from the second side toward the first side in the second direction, the third fin structure being shorter than the first fin structure in the second direction; and a fourth fin structure extending from the first side to the second side in the second direction. The plurality of SRAM cells are arranged in m-rows×n-columns matrix, where n and m are natural numbers of 2 or more. No fin structure is disposed in an area outside the m-rows×n-columns matrix in the first direction within a distance of ¼ of a length of the top side.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a static random access memory (SRAM) including a plurality of SRAM unit cells, the method comprising:
    forming first dummy patterns over a substrate, on which a first mask layer, a second mask layer and a third mask layer are formed in this order;
    forming intermediate dummy patterns on sidewalls of the first dummy patterns to fill space between the first dummy patterns;
    removing the first dummy patterns, thereby leaving the intermediate dummy patterns over the third mask layer of the substrate;
    patterning the third mask layer by using the intermediate dummy patterns;
    patterning the second mask layer by using the patterned third mask layer, thereby forming second dummy patterns;
    forming sidewall spacer layers on sidewalls of the second dummy patterns;
    removing the second dummy patterns, thereby leaving the sidewall spacer layers as hard mask patterns over the substrate;
    patterning the first mask layer by using the hard mask patterns as an etching mask; and patterning the substrate by using the patterned first mask layer as an etching mask, wherein:

each of the plurality of SRAM unit cells is defined by a cell boundary in plan view, and within the cell boundary of each of the plurality of SRAM unit cells, only two first dummy patterns are included in plan view.

2. The method of claim 1, wherein the two first dummy patterns have the same dimensions with each other.

3. The method of claim 1, wherein the hard mask patterns are arranged with a uniform interval within the cell boundary.

4. The method of claim 1, wherein the first dummy patterns are made of poly-silicon.

5. The method of claim 1, wherein the first mask layer includes silicon nitride and silicon oxide disposed on the silicon nitride.

6. The method of claim 1, wherein the second dummy patterns are made of a silicon nitride based material.

7. The method of claim 1, wherein the sidewall spacer layers are made of a silicon oxide based material.

8. The method of claim 1, wherein the forming the intermediate dummy patterns includes:

forming a blanket layer for the intermediate dummy patterns over the first dummy patterns; and removing part of the blanket layer disposed over upper surfaces of the first dummy patterns.

9. The method of claim 1, wherein the forming the sidewall spacer layers includes:

forming a blanket layer for the sidewall spacer layers over the second dummy patterns; and performing anisotropic etching on the blanket layer, thereby leaving the sidewall spacer layers on the sidewalls of the second dummy patterns.

10. The method of claim 1, wherein the method further comprises, after the removing the second dummy patterns and before patterning the substrate, removing extra patterns of the sidewall spacer layers.

11. A method of manufacturing a static random access memory (SRAM) including a plurality of SRAM unit cells, each of the SRAM cells manufactured by the method having such a structure that:

each of the plurality of SRAM unit cells is defined, in plan view, by a cell boundary having a bottom side extending in a first direction, a top side extending in the first direction and opposing to the bottom side, a left side extending in a second direction crossing the first direction and a right side extending in the second direction and opposing to the left side, each of the plurality of SRAM unit cells includes:

a first fin structure extending from the first side to the second side in the second direction;

a second fin structure extending from the first side toward the second side in the second direction, the second fin structure being shorter than the first fin structure in the second direction;

a third fin structure extending from the second side toward the first side in the second direction, the third fin structure being shorter than the first fin structure in the second direction; and a fourth fin structure extending from the first side to the second side in the second direction, the method comprising patterning a substrate by using hard masks formed on the substrate, which is patterned by using first hard mask patterns, thereby forming the first to fourth fin structures, wherein:

the first hard mask patterns are formed by:

forming first dummy patterns on the substrate;

forming a blanket layer of a first material over the first dummy patterns;

etching the blanket layer of the first material, thereby forming the first mask patterns on sidewalls of the first dummy patterns; and removing the first dummy patterns, thereby leaving the first hard mask patterns, the first dummy patterns are formed by:

forming second dummy patterns on the substrate, on which a first mask layer, a second mask layer and a third mask layer are formed in this order;

forming a blanket layer of a second material over the second dummy patterns;

etching the blanket layer of the second material, thereby forming the intermediate dummy patterns on sidewalls of the second dummy patterns and between the second dummy patterns;

removing the second dummy patterns, thereby leaving the intermediate dummy patterns;

patterning the third mask layer by using the intermediate dummy patterns as an etching mask; and patterning the second mask layer by using the patterned third mask layer as an etching mask, thereby forming the first dummy patterns, and within the cell boundary of each of the plurality of SRAM unit cells, only two second dummy patterns are included in plan view.

12. The method of claim 11, wherein the two second dummy patterns have the same dimensions as each other.

13. The method of claim 11, wherein:

the two second dummy patterns includes a first-second dummy pattern and a second-second dummy pattern, a left edge of the first-second dummy pattern, which extends in the second direction and is closer to the left side, is located substantially at a position where a left edge of the first fin structure, which extends in the second direction and is closer to the left side, is located in plan view, a right edge of the first-second dummy pattern, which extends in the second direction and is closer to the right side, is located substantially at a position where a right edge of the second fin structure, which extends in the second direction and is closer to the right side, is located in plan view, a left edge of the second-second dummy pattern, which extends in the second direction and is closer to the left side, is located substantially at a position where a left edge of the third fin structure, which extends in the second direction and is closer to the left side, is located in plan view, and a right edge of the second-second dummy pattern, which extends in the second direction and is closer to the right side, is located substantially at a position where a right edge of the fourth fin structure, which extends in the second direction and is closer to the right side, is located in plan view.

14. The method of claim 11, wherein the second dummy patterns are made of poly-silicon.

15. The method of claim 11, wherein the third mask pattern includes a silicon oxide and silicon nitride formed on the silicon oxide.

16. The method of claim 11, wherein the second material is a silicon nitride based material.

17. The method of claim 11, wherein the first material is a silicon oxide based material.

18. The method of claim 11, wherein in forming the first hard mask patterns, after removing the first dummy pattern, part of the first hard mask patterns is removed so that two of the first hard mask patterns have a length corresponding to the second and third fin structures.

19. The method of claim 11, wherein:
extra first hard mask patterns are formed when the first hard mask patterns are formed, the extra first hard mask patterns being formed between the left side and one of the first hard mask patterns corresponding to the first fin structure and between the right side and one of the first hard mask patterns corresponding to the fourth fin structure, and
when removing the part of the first mask patterns, the extra first hard mask patterns are removed.

20. A method of manufacturing a static random access memory (SRAM) including a plurality of SRAM unit cells each including six fin field effect transistors, the method comprising:
forming a first mask layer, a second mask layer and a third mask layer are formed in this order over a substrate;
forming first dummy patterns on the third mask layer;
forming intermediate dummy patterns on sidewalls of the first dummy patterns to fill space between the first dummy patterns;
removing the first dummy patterns, thereby leaving the intermediate dummy patterns over the third mask layer of the substrate;
patterning the third mask layer by using the intermediate dummy patterns;
patterning the second mask layer by using the patterned third mask layer, thereby forming second dummy patterns;
forming sidewall spacer layers on sidewalls of the second dummy patterns;
removing the second dummy patterns, thereby leaving the sidewall spacer layers as hard mask patterns over the substrate;
patterning the first mask layer by using the hard mask patterns as an etching mask; and
patterning the substrate by using the patterned first mask layer as an etching mask, thereby forming fin structures, wherein:
each of the plurality of SRAM unit cells is defined by a cell boundary in plan view, and
within the cell boundary of the plurality of SRAM unit cells, only two first dummy patterns are included in plan view.

* * * * *